(12) United States Patent
Noguchi et al.

(10) Patent No.: US 9,379,095 B2
(45) Date of Patent: *Jun. 28, 2016

(54) PHOTOCOUPLER

(71) Applicant: Kabushiki Kaisha Toshiba, Minato-ku, Tokyo (JP)

(72) Inventors: Yoshio Noguchi, Fukuoka-ken (JP); Mami Yamamoto, Oita-ken (JP); Naoya Takai, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/755,581

(22) Filed: Jun. 30, 2015

(65) Prior Publication Data

US 2015/0303180 A1     Oct. 22, 2015

Related U.S. Application Data

(63) Continuation of application No. 14/161,872, filed on Jan. 23, 2014, now Pat. No. 9,099,602.

(30) Foreign Application Priority Data

Aug. 30, 2013  (JP) .................................. 2013-180163

(51) Int. Cl.
*H01L 25/16* (2006.01)
*H01L 31/02* (2006.01)
(Continued)

(52) U.S. Cl.
CPC ........ *H01L 25/167* (2013.01); *H01L 31/02002* (2013.01); *H01L 31/14* (2013.01); *H01L 31/162* (2013.01); *H01L 2224/48247* (2013.01); *H01L 2924/00* (2013.01); *H01L 2924/13091* (2013.01)

(58) Field of Classification Search
None
See application file for complete search history.

(56) References Cited

U.S. PATENT DOCUMENTS

| | | |
|---|---|---|
| 4,851,695 A | 7/1989 | Stein |
| 6,285,084 B1 | 9/2001 | Hikita et al. |
| 6,586,269 B2 | 7/2003 | Kondoh et al. |

(Continued)

FOREIGN PATENT DOCUMENTS

| | | |
|---|---|---|
| JP | 09-036413 A | 2/1997 |
| JP | 11-274549 A | 10/1999 |

(Continued)

OTHER PUBLICATIONS

Japanese Office Action issued on Dec. 9, 2015 in corresponding Japanese Application No. 2013-180163, along with English translation thereof.

*Primary Examiner* — Khaja Ahmad
(74) *Attorney, Agent, or Firm* — White & Case LLP

(57) ABSTRACT

A photocoupler includes: a support substrate; a MOSFET; a light receiving element; a light emitting element; and a bonding layer. The support substrate includes an insulating layer, input and output terminals. The MOSFET is bonded to the support substrate. The MOSFET has a first surface having an operation region. The light receiving element includes p-n junction and is bonded to the MOSFET. The light receiving element has first and second surfaces. The first surface includes a light reception region, a first electrode, and a second electrode. The light emitting element is connected to the input terminal. The light emitting element has first and second surfaces. The first surface includes first and second electrodes. The second surface has a light emitting region. The bonding layer is configured to bond the light emitting element to the light reception region.

5 Claims, 5 Drawing Sheets

(51) Int. Cl.
  *H01L 31/16* (2006.01)
  *H01L 31/14* (2006.01)

(56) References Cited

U.S. PATENT DOCUMENTS

| | | |
|---|---|---|
| 7,847,299 B2 | 12/2010 | Noma |
| 2005/0035356 A1 | 2/2005 | Kek et al. |
| 2005/0207697 A1 | 9/2005 | Kek et al. |
| 2007/0187629 A1* | 8/2007 | Matsuyama ............ H01L 31/14 250/551 |
| 2008/0296520 A1* | 12/2008 | Noguchi ............... H01L 31/167 250/551 |
| 2011/0084365 A1 | 4/2011 | Law et al. |

FOREIGN PATENT DOCUMENTS

| | | |
|---|---|---|
| JP | 2005-064513 A | 3/2005 |
| JP | 2008177218 A | 7/2008 |

* cited by examiner

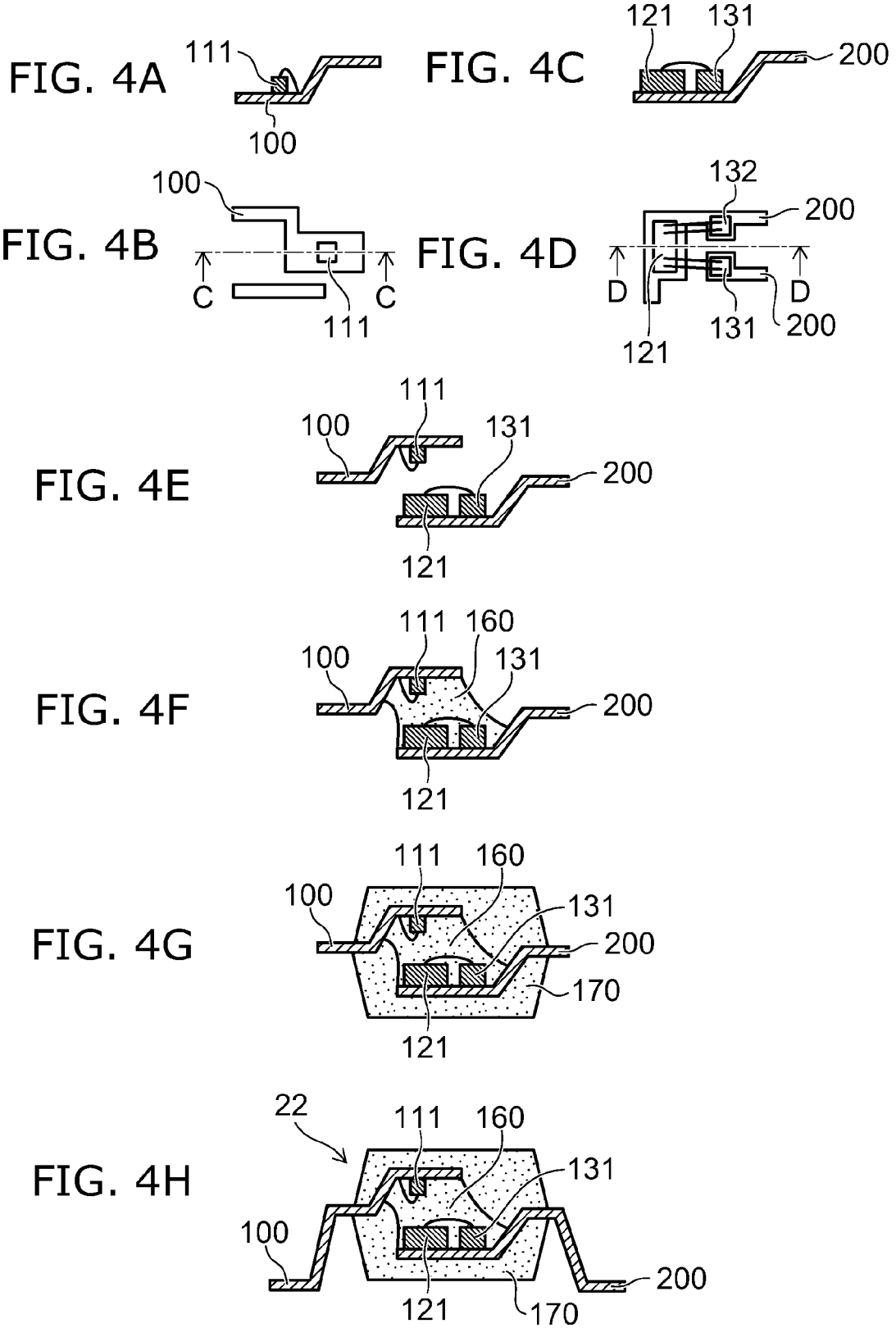

PHOTOCOUPLER

CROSS-REFERENCE TO RELATED APPLICATIONS

This application is a continuation of application Ser. No. 14/161,872, filed Jan. 23, 2014, which is based upon and claims the benefit of priority from Japanese Patent Application No. 2013-180163, filed on Aug. 30, 2013; the entire contents of each are incorporated herein by reference.

FIELD

Embodiments described herein relate generally a photocoupler.

BACKGROUND

Photocouplers (including photorelays) convert an input electrical signal into an optical signal by using a light emitting element; and an electrical signal can be output by a light receiving element after receiving the optical signal. Therefore, the photocoupler can transmit the electrical signal in a state in which the input and output are insulated from each other.

In industrial equipment, office equipment, and household appliances, different power supply systems such as a DC voltage system, an AC power supply system, a telephone line system, a control system, etc., are disposed inside one device. However, operation errors may occur in the case where different power supply systems and circuit systems are directly coupled.

The operation errors can be suppressed if a photocoupler is used because the different power supplies are insulated from each other.

For example, many photocouplers are used in an inverter air conditioner or the like for a load that may be an alternating current load. In the case where photocouplers are used for signal switching in a tester application, an extremely large number of photocouplers are mounted. In such a case, it is extremely desirable to reduce the photocoupler size due to the need to reduce the mounting surface area on the substrate.

BRIEF DESCRIPTION OF THE DRAWINGS

FIGS. 4A to 4H are schematic views showing manufacturing processes of an opposed-type photocoupler according to a second comparative example.

DETAILED DESCRIPTION

In general, according to one embodiment, a photocoupler includes: a support substrate; a MOSFET; a light receiving element; a light emitting element; and a bonding layer. The support substrate includes an insulating layer, an input terminal, and an output terminal. The MOSFET is bonded to the support substrate. The MOSFET has a first surface having an operation region. The MOSFET includes a drain connected to the output terminal. The light receiving element includes p-n junction and is bonded to the MOSFET to be connected to the MOSFET. The light receiving element has a first surface and a second surface on a side opposite to the first surface. The first surface includes a light reception region, a first electrode, and a second electrode. The second surface is insulated from the operation region of the MOSFET. The light emitting element is connected to the input terminal. The light emitting element has a first surface and a second surface on a side opposite to the first surface. The first surface includes a first electrode and a second electrode. The second surface has a light emitting region of emitted light. And the bonding layer is configured to bond the light emitting element to the light reception region of the light receiving element. The bonding layer is transparent and insulative. The MOSFET is configured to switch ON or OFF by photovoltaic power generated in the p-n junction due to the emitted light being irradiated.

Embodiments of the invention will now be described with reference to the drawings.

Figure 1A:
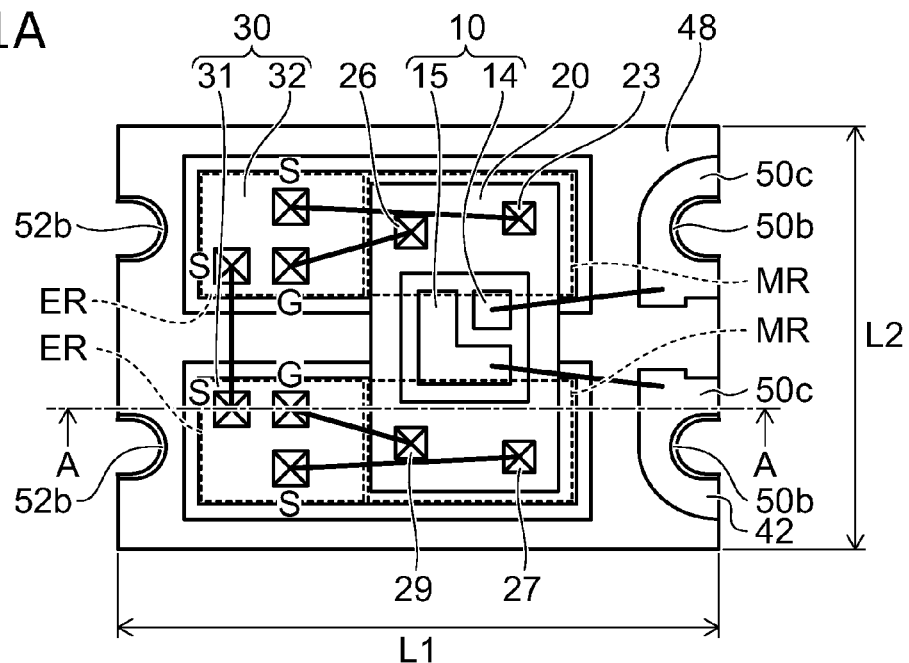
FIG. 1A is a schematic plan view of a photocoupler according to a first embodiment.
Figure 1B:
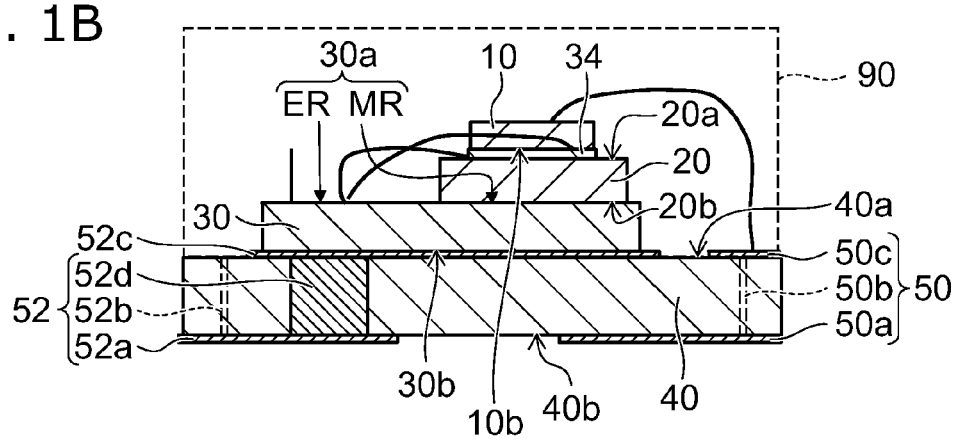
FIG. 1B is a schematic cross-sectional view along line A-A.
Figure 1C:
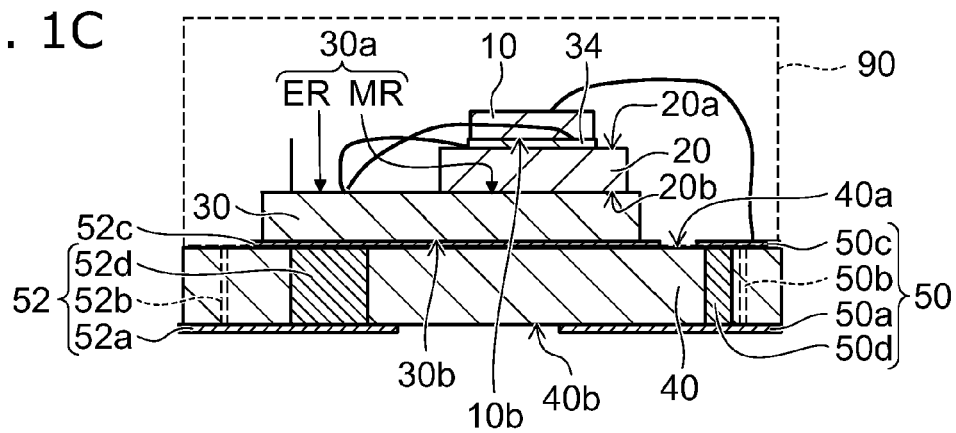
FIG. 1C is a schematic cross-sectional view showing a modification of the input terminal.

FIG. 1A is a schematic plan view of a photocoupler according to a first embodiment; FIG. 1B is a schematic cross-sectional view along line A-A; and FIG. 1C is a schematic cross-sectional view showing a modification of the input terminal.

The photocoupler includes a light emitting element 10, a light receiving element 20, a bonding layer 34, a couple of MOSFET 30, and a support substrate 48.

The support substrate 48 includes an insulating layer 40, input terminals 50, and output terminals 52. The insulating layer 40 may be a base member such as glass epoxy, etc. The input terminals 50 and the output terminals 52 may include a conductive unit provided on the upper surface of the base member of the insulating layer 40 and a protective layer made of a plating layer of Au, Ag, Pd, etc., provided on the front surface of the conductive unit.

The MOSFET 30 is bonded to the support substrate 48 and has a first surface 30a that includes operation regions ER and bonding regions MR on the side opposite to the operation regions ER.

The light receiving element 20 is bonded to the bonding regions MR of the MOSFET 30 and has a first surface 20a and a second surface 20b on the side opposite to the first surface 20a, where the first surface 20a includes a light reception region, first electrodes 26 and 29, and second electrodes 23 and 27. The second surface 20b of the light receiving element 20 is insulated from the operation regions ER of the first surface 30a of the MOSFET 30.

To insulate the MOSFET 30 from the light receiving element 20, for example, it is sufficient to provide an insulating layer in the bonding region MR of the MOSFET 30. Or, it is sufficient to provide an insulating layer at the second surface 20b of the light receiving element 20. Or, it is sufficient to provide an insulative bonding layer between the second surface 20b of the light receiving element 20 and the bonding regions MR of the first surface 30a of the MOSFET 30. Or, a conductive shield film that is insulated may be disposed between the second surface 20b of the light receiving element 20 and the bonding regions MR of the first surface 30a of the MOSFET 30. The conductive shield film reduces the radiation noise between the chips. The conductive shield film may have a sheet configuration, may be a continuous body, may have a scattered island configuration or a line configuration, or may be a combination of these configurations.

Emitted light traveling downward from a light emitting layer is emitted from a second surface 10b of the light emitting element 10.

The bonding layer 34 is transparent and insulative and bonds a second surface 10b of the light emitting element 10 to a light reception region 22 of the light receiving element 20.

The light receiving element 20 generates photovoltaic power in the p-n junction of the light reception region due to the light emitted from the light emitting element 10. The MOSFET 30 has the first surface 30a that includes the operation regions ER and the bonding regions MR provided on the side opposite to the operation regions ER. The operation regions ER include gate electrodes G that are connected to the first electrodes 26 and 29 of the light receiving element 20, and source electrodes S that are connected to the second electrodes 23 and 27 of the light receiving element 20.

The MOSFET 30 is switched ON or OFF when the photovoltaic power is supplied to the gates of the MOSFET 30. Thus, the photocoupler is capable of outputting an electrical signal corresponding to the input electrical signal.

The input terminals 50 are provided on the bonding region MR side of the MOSFET 30 to be connected respectively to a first electrode 14 and a second electrode 15 of the light emitting element 10. The output terminals 52 that are insulated from the input terminals are connected to the drains D of the MOSFET 30.

The output terminals 52 may include die pad units 52c that are provided at a first surface 40a of the insulating layer 40. The MOSFET 30 is bonded to the die pad units 52c. If the MOSFET is a vertical MOSFET, the structure can be simple because back surfaces 30b which are the drains D of the chips can be connected to the die pad units 52c of the output terminals 52.

Each of the input terminals 50 may further include a back surface unit 50a provided at a second surface 40b of the insulating layer 40 on the side opposite to the first surface 40a and a side surface unit 50b provided at the side surface of the insulating layer 40; and each of the output terminals 52 may further include a back surface unit 52a provided at the second surface 40b of the insulating layer 40 on the side opposite to the first surface 40a and a side surface unit 52b provided at the side surface of the insulating layer 40. The die pad unit 52c and the back surface unit 52a can be connected to each other by a through-metal layer 52d provided inside the insulating layer 40.

As shown in FIG. 1C, an upper surface unit 50c and the back surface unit 50a of the input terminal 50 can be connected to each other by a through-metal layer 50d provided inside the insulating layer 40. Thus, the upper surface unit 50c and the back surface unit 50a can be connected to each other more reliably.

The support substrate 48, the MOSFET 30, the light receiving element 20, and the light emitting element 10 may be covered with a sealing resin layer 90. Misoperations due to light from the outside can be suppressed by the sealing resin layer 90 being light-shielding. The sealing resin layer 90 may be epoxy, silicone, etc. The photocoupler is not limited to the structure shown in FIGS. 1A and 1B and may include an optically-coupled insulating device including a photocoupler, a photorelay, etc.

Figure 2A:
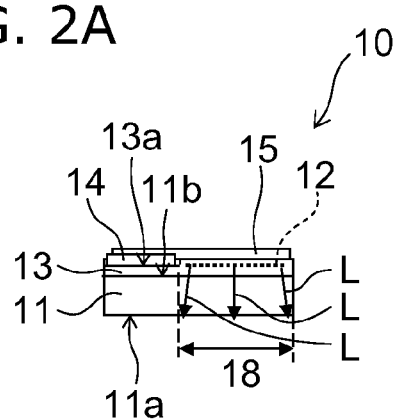
FIG. 2A is a schematic side view of the light emitting element.
Figure 2B:
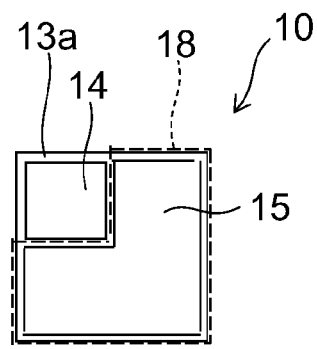
FIG. 2B is a schematic plan view of the light emitting element.
Figure 2C:
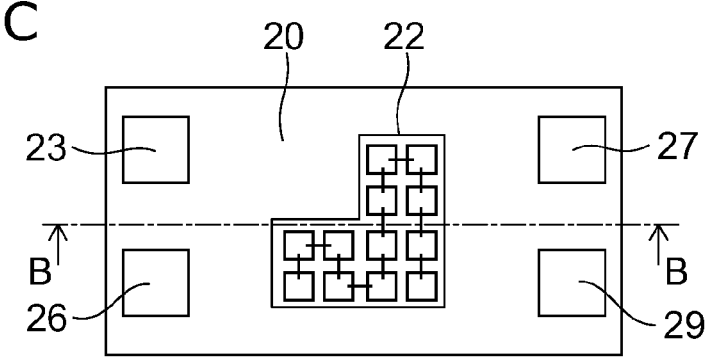
FIG. 2C is a schematic plan view of the light receiving element.
Figure 2D:
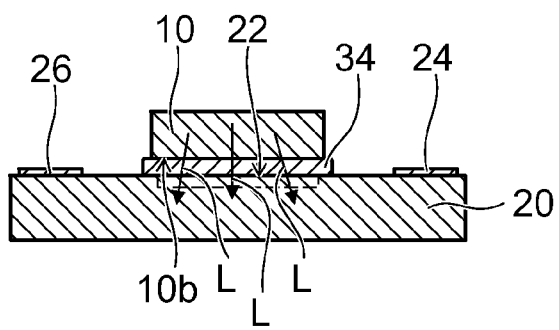
FIG. 2D is a schematic cross-sectional view of the stacked structure along line B-B.
Figure 2E:
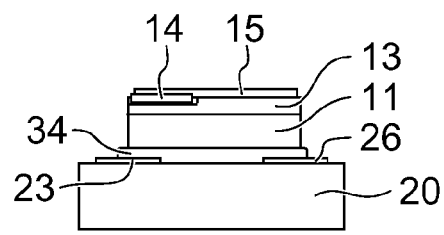
FIG. 2E is a schematic side view of the stacked structure.

FIG. 2A is a schematic side view of the light emitting element; FIG. 2B is a schematic plan view of the light emitting element; FIG. 2C is a schematic plan view of the light receiving element; FIG. 2D is a schematic cross-sectional view of the stacked structure along line B-B; and FIG. 2E is a schematic side view of the stacked structure.

As shown in FIG. 2A, a substrate 11 is transparent, has a first surface 11a, and has a second surface 11b that is on the side opposite to the first surface 11a. A semiconductor stacked body 13 that includes a light emitting layer 12 (the dotted line) is provided on the second surface 11b. The semiconductor stacked body 13 has a stepped portion at the surface of the semiconductor stacked body 13 on the side opposite to the substrate 11 side such that the stepped portion is from the front surface to a position lower than the light emitting layer 12. The stepped portion has a bottom surface 13a.

In the case where the substrate 11 is made of GaAs, the bandgap wavelength of the substrate 11 is about 870 nm. Therefore, the wavelength of emitted light L from the light emitting layer that has a MQW (Multi Quantum Well) structure, etc., may be, for example, longer than 870 nm and shorter than 1100 nm. In the case where the substrate 11 is GaP having a bandgap wavelength of about 500 nm, the wavelength of the emitted light G may be 700 to 1100 nm, etc.

The first electrode 14 is provided at the bottom surface 13a of the stepped portion; and the second electrode 15 is provided at the front surface of the semiconductor stacked body 13 other than the stepped portion. In the case where the second electrode 15 covers the light emitting layer 12 from above, much of the light emitted upward from the light emitting layer 12 is reflected by the second electrode 15; and outward emitted light can be reduced. To increase the reflectance further, an ohmic bonding metal layer that does not include an alloy layer or a stacked structure of a transparent semiconductor electrode and a reflective metal layer also may be employed to suppress the light radiated outward from the upper surface; and a configuration having a minimum resin thickness to suppress light leakage to the outside from the sealing resin layer 90 also may be used. The emitted light traveling downward from the light emitting layer 12 is emitted from a light emitting region 18 of the second surface 10b of the light emitting element 10 and is incident on the light reception region 22 of the light receiving element 20. The photovoltaic power can be increased by the light reception region 22 including, for example, p-n junction regions connected in series, etc.

The light reception region 22 of the light receiving element 20 shown in FIG. 2C may be included in the light emitting region 18 of the light emitting element 10 as viewed from above. Thus, the light reception region 22 does not jut from the light emitting element 10. Therefore, the distribution of the photovoltaic power inside the light reception region 22 can be averaged; and such a structure is therefore more favorable. The light receiving element 20 includes the first electrodes 26 and 29 that are connected to one conductivity-type layer of the p-n junction and the second electrodes 23 and 27 that are connected to the other conductivity-type layer of the p-n junction.

As shown in FIG. 2D, the emitted light L that is emitted from the light emitting region 18 and passes through the bonding layer 34 is incident on the light reception region 22. Because the bonding layer 34 is thin, the emitted light L from the light emitting element 10 is efficiently incident on the light reception region 22 from the light emitting region 18. Also, the light leakage to other control element units can be suppressed; and the stability of the operation increases. The first and second electrodes 14 and 15 of the light emitting element 10 are connectable respectively to the input terminals 50 by bonding wires of Au, Cu, Ag, etc.

The first electrodes 26 and 29 of the light receiving element 20 are connectable to the gate electrodes G of the MOSFET 30; and the second electrodes 23 and 27 are connectable to the source electrodes S of the MOSFET 30.

In the first embodiment, the MOSFET 30, the light receiving element 20, and the light emitting element 10 are stacked in this order on the support substrate 48. Therefore, the planar size and thickness of the package decrease; and it is easy to downsize the photocoupler.

In the case of one MOSFET 30, DC load control can be performed. On the other hand, in the case where two MOSFETs 31 and 32 have a common-source connection as shown in FIGS. 1A and 1B, AC load control can be performed.

Figure 3A:
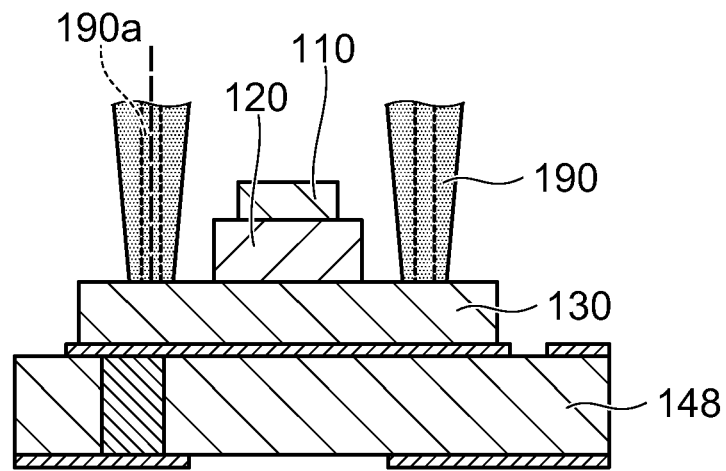
FIG. 3A is a schematic cross-sectional view of a photocoupler according to a first comparative example prior to wire bonding.
Figure 3B:
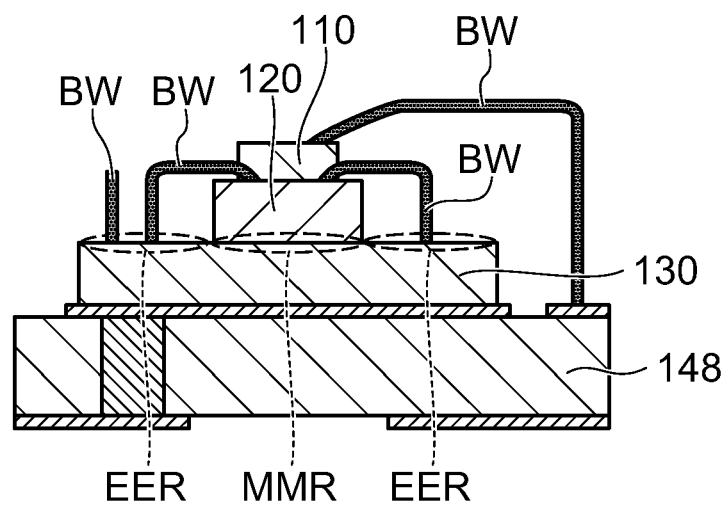
FIG. 3B is a schematic cross-sectional view after wire bonding.

FIG. 3A is a schematic cross-sectional view of a photocoupler according to a first comparative example prior to wire bonding; and FIG. 3B is a schematic cross-sectional view after wire bonding of the embodiment.

In the comparative example as shown in FIG. 3A, operation regions EER that include a gate electrode and a source electrode are provided on two sides of a bonding region MMR at the front surface of a MOSFET 130. A bonding wire BW passes through a through-hole 190a provided at the vicinity of the central axis of a capillary 190 and is connected to the electrodes by being pressed onto the electrodes. Even in the case where the diameter of the bonding wire BW is small and is not more than 30 μm, the outer diameter of the capillary 190 is nearly 200 μm. Therefore, space for the bonding wire BW is necessary on the two sides of the bonding region MMR; and the chip size of the MOSFET 130 becomes large.

Conversely, on the input terminal 50 side of the first surface 30a of the MOSFET 30 in the first embodiment as shown in FIG. 1B, the operation regions ER are not provided; and the side surface of the MOSFET 30 is proximal to the side surface of the light receiving element 20. By providing the operation regions ER only on the output terminal 52 side, the chip size of the MOSFET 30 can be reduced. Further, a region inside the package for bonding the light receiving element 20 and the light emitting element 10 is unnecessary. Therefore, it is easy to downsize the photocoupler. As a result, the size of the photocoupler can be reduced to have, for example, a width L2 of 1.35 mm and a length L1 of 1.9 mm; and high-density mounting inside the device is possible.

Further, the height of the wires can be low and the sealing resin layer thickness can be thin because the bonding of the bonding wires on the lower surface side can be made first bonding and the bonding of the bonding wires on the upper surface side can be made second bonding; and the size of the photocoupler can be reduced because the bonding area on the lower surface side can be small. Moreover, as shown in FIG. 3B, the bonding strength per resin deformation amount is increased and the reliability for resin deformation and peeling is increased because the bonding on the lower surface side is performed firstly; and after forming the first bonding ball, the wire is lifted perpendicularly and then moved to be parallel to the element for the second bonding in which compression bonding is performed on the upper surface side of elements at the central portion of the photocoupler. By disposing the bonding wires between the elements to be non-parallel (oblique) to the exterior form of the device, as shown in FIG. 1A, it is also possible to suppress the stress due to the expansion and contraction in the vertical and horizontal directions caused by the thermal deformation of the sealing resin by dispersing the stress in the wire length direction. It is more desirable for the longer bonding wires to be disposed along directions toward the center of the device.

FIGS. 4A to 4H are schematic views showing manufacturing processes of an opposed-type photocoupler according to a second comparative example. Namely, FIG. 4A is a partial schematic cross-sectional view of a light emission-side leadframe; FIG. 4B is a partial schematic plan view of the light emission-side leadframe; FIG. 4C is a partial schematic cross-sectional view of a light reception-side leadframe; FIG. 4D is a partial schematic plan view of the light reception-side leadframe; FIG. 4E is a schematic cross-sectional view of the two leadframes opposing each other; FIG. 4F is a schematic cross-sectional view of a structure in which the chips are covered with a transparent resin; FIG. 4G is a schematic cross-sectional view of a structure in which the transparent resin and the leadframes are molded with a light-shielding resin; and FIG. 4H is a cross-sectional view after lead-forming.

As shown in FIGS. 4A and 4B, a light emitting element 111 is bonded to the light emission-side leadframe 100. FIG. 4A is a partial schematic cross-sectional view along line C-C. As shown in FIGS. 4C and 4D, a light receiving element 121 and two MOSFETs 131 and 132 are bonded to the light reception-side leadframe 200. FIG. 4C is a partial schematic cross-sectional view along line D-D. As shown in FIG. 4E, the light emission-side leadframe 100 and the light reception-side leadframe 200 oppose each other. The light emitting element 111, the light receiving element 121, and the two MOSFETs 131 and 132 are covered with the transparent resin 160. The transparent resin 160 is used as a light propagation path; and the configuration of the transparent resin 160 is decided by surface tension, etc.

As shown in FIG. 4G, the transparent resin 160, the light emission-side leadframe 100, and the light reception-side leadframe 200 are sealed by the light-shielding resin 170. As shown in FIG. 4H, the photocoupler is made by performing cutting, forming, etc., for the light emission-side leadframe 100 and the light reception-side leadframe 200.

In the second comparative example, it is difficult to downsize the planar size of the package because the light receiving element 121 and the two MOSFETs 131 and 132 are disposed in a plane. Moreover, thickness reduction is difficult because the transparent resin 160 and the light-shielding resin 170 that surrounds the transparent resin 160 are thick. Further, it is difficult to improve the suitability for mass production for the opposed-type; and cost reductions are not easy.

Conversely, in the first embodiment, thickness reduction and downsizing of the planar size of the package are easy because three levels, i.e., the light emitting element 10, the light receiving element 20, and the MOSFET 30, are stacked. The number of products per production unit can be higher than that of the opposed-type that uses leadframes; the suitability for mass production can be improved; and cost reductions are easy.

Figure 5:
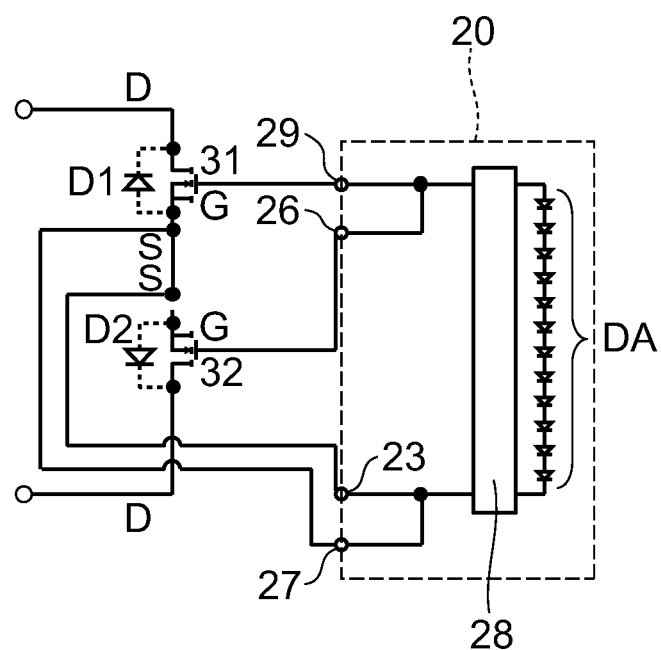
FIG. 5 is a configuration diagram of the photocoupler according to the first embodiment.

FIG. 5 is a configuration diagram of the photocoupler according to the first embodiment.

The light receiving element 20 may further include a control circuit 28. The control circuit 28 is connected to the second electrodes 23 and 27 and the first electrodes 26 and 29 of the photodiode array DA. When the optical signal is ON, the control circuit 28 supplies the current and voltage of the photodiode array DA to the MOSFETs 30 and 31 (e.g., switches a connection from the terminals 26 and 29 to the terminals 23 and 27 to be open). When the optical signal is OFF, the control circuit 28 turns the MOSFETs 30 and 31 OFF by shorting the connection between the gates G and the sources S of the MOSFETs 30 and 31 to remove the stored charge (e.g., shorting the connection from the terminals 26 and 29 to the terminals 23 and 27). The simplest configuration of the control circuit 28 is a configuration in which a resistor is connected between the terminals 26 and 29 and the terminals 23 and 27. In the case of such a configuration, a voltage can be supplied to the gates of the MOSFETs 31 and 32 that have a common-source connection.

The MOSFETs 31 and 32 may be, for example, n-channel enhancement mode MOSFETs. The MOSFETs 31 and 32 are connected to the second electrodes 23 and 27 of the photodiode array 20a. The gates of the MOSFETs 31 and 32 are connected to the first electrodes 26 and 29; and drains D of the MOSFETs 31 and 32 are used as the output terminals 52.

When the optical signal is ON, both MOSFETs 31 and 32 are switched ON and are connected via the output terminals 52 to an external circuit that includes a power supply and a load. On the other hand, when the optical signal is OFF, both MOSFETs 31 and 32 are switched OFF; and the MOSFETs 31 and 32 are cut off from the external circuit. When the common-source connection is used, linear output is possible; and the switching of analog signals and AC signals is easy.

Normally, parasitic p-n diodes D1 and D2 illustrated by the broken lines exist between the drains and the sources; and one selected from the parasitic diodes D1 and D2 can be used as a portion of the current path when the MOSFETs 31 and 32 are ON.

The amount of heat generated by the MOSFETs 31 and 32 increases during high current operation of the MOSFETs 31 and 32. In such a case, in the case where the through-metal layer 52d that is provided inside the insulating layer 40 is provided below the exothermic units of the MOSFETs 31 and 32, the through-metal layer 52d can be used as a heat dissipation path; and the thermal resistance can be reduced.

According to the photocoupler of the embodiment, thickness reduction and downsizing of the planar size are easy. The photocoupler can be widely used in industrial equipment, office equipment, household appliances, etc. Therefore, the operations of devices that include different built-in power supplies can be maintained normally and stably.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A photocoupler, comprising:
   a substrate including an insulating layer, an input terminal, and an output terminal;
   a MOSFET provided on the substrate, the MOSFET having a first surface having a first electrode pad and a first bonding region;
   a light receiving element provided on the first bonding region, the light receiving element having a first surface and a second surface opposite to the first surface, the first surface including a first region, a second region, and a first electrode being located at the second region;
   a light emitting element electrically connected to the input terminal, the light emitting element having a first surface and a second surface opposite to the first surface, the first surface including a first electrode and a second electrode, the second surface having a light emitting region of emitted light;
   a bonding layer configured to bond the light emitting element to the first region of the light receiving element; and
   a first bonding wire coupling the first electrode pad of the MOSFET to the first electrode of the light receiving element,
   wherein the light emitting element overlaps a portion of the light receiving element, and the MOSFET.

2. The photocoupler according to claim 1, wherein the output terminal includes a die pad unit provided at a first surface of the insulating layer, and the MOSFET is bonded to the die pad unit.

3. The photocoupler according to claim 2, wherein the input terminal includes a back surface unit and a side surface unit, and the output terminal includes a back surface unit and a side surface unit, each of the back surface units being provided at a second surface of the insulating layer on a side opposite to the first surface of the insulating layer, each of the side surface units being provided at a side surface of the insulating layer.

4. The photocoupler according to claim 3, wherein the die pad unit of the output terminal is connected to the back surface unit of the output terminal by a through-metal layer provided inside the insulating layer.

5. The photocoupler according to claim 1, wherein the light receiving element has a photodiode array.

* * * * *